United States Patent
Hively et al.

[11] Patent Number: 5,808,474
[45] Date of Patent: Sep. 15, 1998

[54] TEST SOCKET FOR TESTING INTEGRATED CIRCUIT PACKAGES

[75] Inventors: James W. Hively, Sunnyvale, Calif.; Michael DiPietro, Vestal, N.Y.

[73] Assignees: LSI Logic Corporation, Milpitas, Calif.; International Business Machines, Armonk, N.Y.

[21] Appl. No.: 687,762

[22] Filed: Jul. 26, 1996

Related U.S. Application Data

[63] Continuation of Ser. No. 347,783, Nov. 30, 1994, abandoned.

[51] Int. Cl.$^6$ .................................................. G01R 31/02
[52] U.S. Cl. ........................................ 324/755; 324/765
[58] Field of Search ................................... 324/754–755, 324/765; 257/48; 439/65–72; 438/18

[56] References Cited

U.S. PATENT DOCUMENTS

| | | | |
|---|---|---|---|
| 4,099,120 | 7/1978 | Aksu | 324/761 |
| 4,820,976 | 4/1989 | Brown | 324/760 |
| 5,073,117 | 12/1991 | Malhi et al. | 439/71 |
| 5,440,240 | 8/1995 | Wood et al. | 324/765 |
| 5,475,317 | 12/1995 | Smith | 324/760 |
| 5,568,057 | 10/1996 | Kim et al. | 324/755 |

*Primary Examiner*—Vinh P. Nguyen
*Assistant Examiner*—Russell M. Kobert
*Attorney, Agent, or Firm*—Oppenheimer Wolff & Donnelly LLP

[57] ABSTRACT

A socket for testing an integrated circuit ball grid array package having external contacts formed by an array of solder balls is formed with a flexible bladder in the socket bottom. The upper side of the bladder has a test contact pattern that matches the pattern of the solder balls on the package. The side of the bladder carrying the test contact pattern is formed of conventional flexible circuit tape having contacts of spherical, conical or cylindrical shape formed thereon by conventional techniques, with circuit traces also formed on the flexible circuit tape extending to the outside of the socket for connection to test circuitry. Inflation of the bladder drives its test contact pattern against the solder balls of a package held in the socket and forces the flexible test contact substrate of the bladder to conform to any non-planar configuration of the ball grid array.

16 Claims, 2 Drawing Sheets

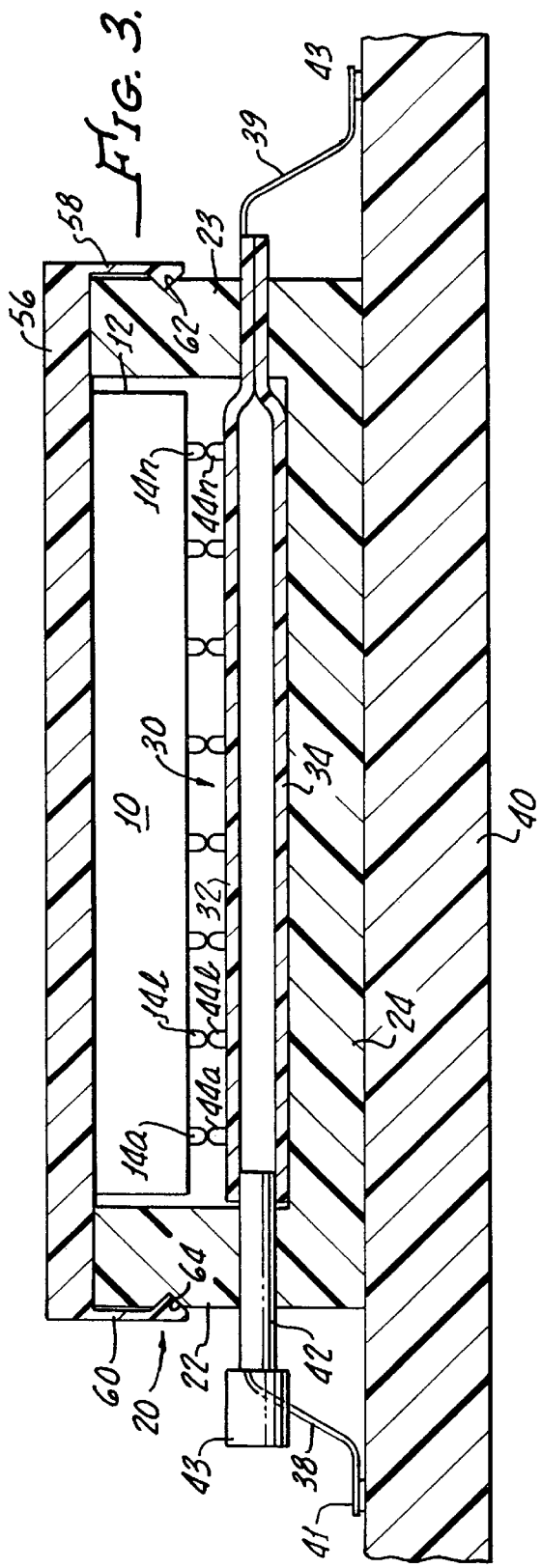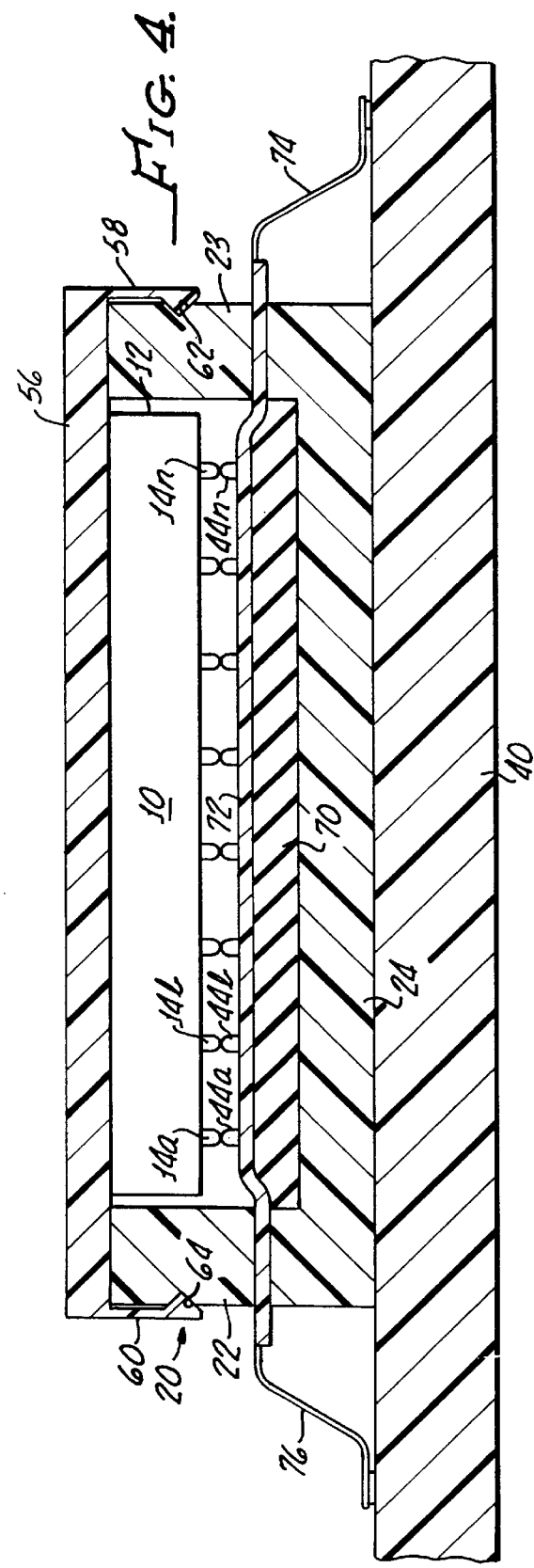

TEST SOCKET FOR TESTING INTEGRATED CIRCUIT PACKAGES

This application is a continuation of U.S. patent application Ser. No. 08/347,783, filed Nov. 30, 1994, now abandoned.

FIELD OF THE INVENTION

The present invention relates to methods and apparatus for testing integrated circuit die packages and more particularly concerns an improved socket for testing a ball grid array package.

BACKGROUND OF THE INVENTION

Integrated circuit dies or chips are generally mounted in various types of ceramic or plastic packages to facilitate handling, transportation, mounting and protection of the die. One type of commonly employed package is a ball grid array package in which one face, such as the bottom face of the package, is provided with all of the electrical connections to external circuitry. In the ball grid array package these electrical connections are in the form of a pattern of solder balls all formed on one face of the package.

To test the ball grid array package before mounting the package and connecting it to other circuitry, it has been the practice to insert the package into an open socket having test contacts formed in the socket bottom. Generally the socket, including its bottom or base, is rigid, and in one prior arrangement includes a number of disc contacts, fixedly mounted in the base, which are connected by means of vias extending through the socket base to pins on the outside of the socket. This provides a pin grid for attachment of the socket and its test contacts to test circuitry. In another arrangement a plurality of rigid spring mounted test pins are individually mounted in the base of the socket and each is individually spring pressed upwardly to contact the balls of the ball grid array package.

The disc type socket arrangement is complex and relatively expensive to manufacture and may not always provide electrical connection between all contacts of the package and the test contacts of the test socket. This is so because the package contacts may lack an adequate degree of planarity, and thus, when the package is inserted into the socket, some of the package contacts may touch the test contacts in the socket before others and prevent an electrical contact between all of the contact elements. The individual spring mounted pins may decrease this problem of lack of planarity of the balls of the ball grid array package but only at costs of excessive complexity, difficulty of precision adjustment and expensive manufacture.

Accordingly, it is an object of the present invention to provide for testing of an integrated circuit chip package by methods and apparatus that avoid or minimize above mentioned problems.

SUMMARY OF THE INVENTION

In carrying out principles of the present invention in accordance with a disclosed embodiment thereof a package test socket is formed with sides, a base and an entrance opening. In the socket, upon the base, is movably mounted a substrate carrying a number of socket test contacts, and means are provided for urging the substrate toward the entrance opening so as to press the test contacts of the substrate against the ball contacts of a package inserted into the socket.

According to a specific embodiment, the substrate is formed of a flexible tape upon which has been formed a plurality of projecting test contacts having a suitable spherical, conical or cylindrical shape, and which are connected by means of traces on the tape to test circuit connecting terminals at the exterior of the socket. Means are provided to urge the test contact bearing substrate away from the base toward the contacts of a package inserted into the socket.

According to another feature of the invention, the substrate forms one side of a flexible bladder or envelope that is mounted on the base within the socket and which is adapted to be pressurized by a fluid that forces the test contact bearing side of the bladder away from the base and against the contacts of a package within the socket. Flexibility of the substrate and the application of pressure over the entire area of the substrate within the socket causes the substrate and its contacts to assume a non-planar shape that matches the non-planar array of package contacts so that all test contacts of the socket are pressed against the respective package contacts even when the package contacts are not entirely planar.

BRIEF DESCRIPTION OF THE DRAWINGS

FIG. 3 illustrates a sectional view of a ball grid array package mounted in a test socket embodying principles of the present invention.

FIG. 4 shows an alternative embodiment of the invention.

DESCRIPTION OF THE PREFERRED EMBODIMENTS

Figure 1:
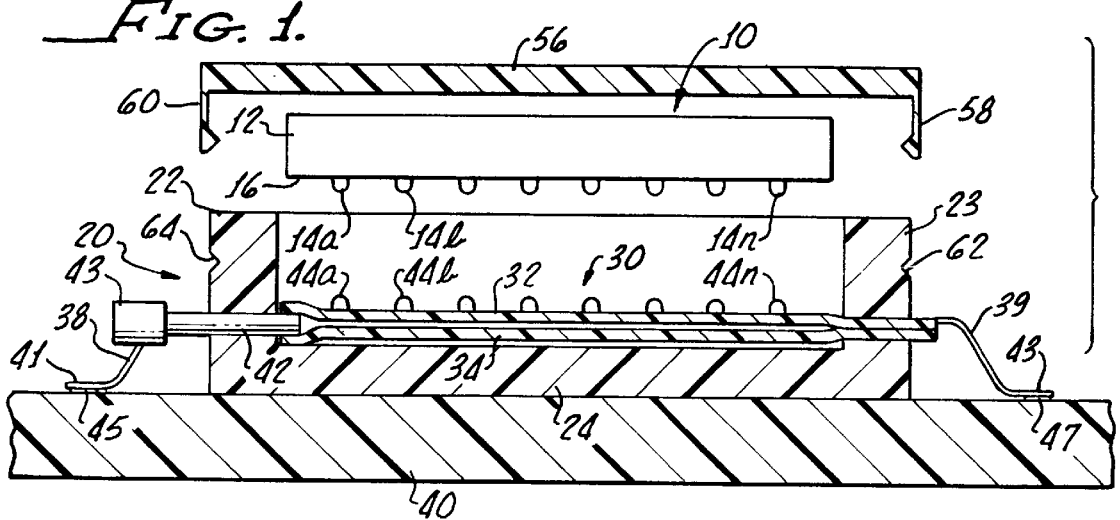
FIG. 1 is a sectional view of a ball grid array package and a test socket therefor, showing the package before entry into the socket, and the socket lid displaced.

A conventional ball grid array package 10, as illustrated in FIG. 1, includes an integrated circuit die (not shown) incorporated in a plastic or ceramic package 12 that provides protection for the enclosed die during transportation, handling, mounting and operation. The die includes a number of die pads (not shown) which are employed to electrically connect the internal circuitry of the die to external circuits or circuit components. The die pads are electrically connected by the package to a plurality of external package terminals or package contacts, such as contacts 14*a*, 14*b*–14*n*, respectively. In the conventional ball grid array package the external contacts 14*a*–14*n* are formed as solder balls secured to electrical contacts on the lower side 16 of the package.

In order to test the packaged die prior to installation and prior to connection to external circuitry it is mounted in a test socket, generally indicated at 20. The socket is formed of four rigid side walls, such as walls 22, 23, a rigid base 24 and an open top or entrance opening extending between upper ends of the side walls. Mounted within the socket upon the base 24 is a bladder 30 formed of a flexible dielectric material. The bladder is formed of a first or upper substrate 32 made of a thin flexible dielectric circuit, such as flexible circuit tape, and a second preferably flexible side or back substrate 34. The two substrates 32,34 are secured and sealed to each other around their periphery by any suitable means, such as an adhesive. Outer portions 38,39 of upper substrate 32 extend through the walls 22,23 of the socket, on all four sides of the socket, to provide a connection to a printed circuit board 40, forming part of the test circuitry.

A conduit 42 also extends through a suitable aperture in socket wall 22 and is connected to and sealed to the walls 32,34 of the bladder 30 to enable introduction of a pressurized fluid, such as air or a suitable hydraulic fluid; into the interior of the bladder 30. Conduit 42 terminates in a fitting 43 which may be connected to an additional conduit (not shown).

Figure 2:
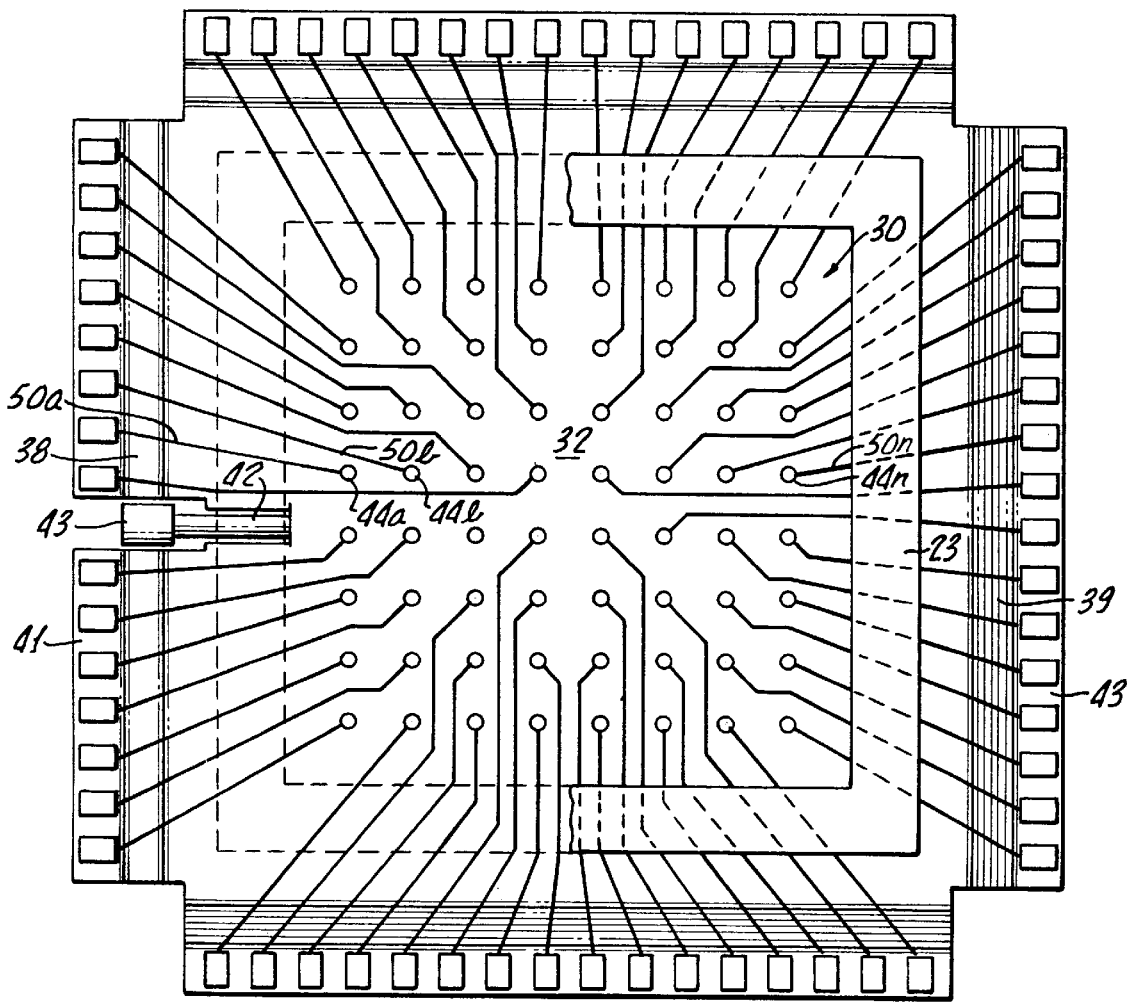
FIG. 2 is a plan view of the socket of FIG. 1.

The flexible circuit substrate 32 is made of a thin layer of dielectric polyimide such as Kapton, one to two millimeters thick, having circuit traces and contacts formed thereon. A plurality of test contacts 44a, 44b–44n are formed on the substrate and positioned in a pattern and configuration that exactly matches the pattern and configuration of the package solder ball contacts 14a–14n. Test contacts 44a are formed on the surface of substrate 32 and connected to respective ones of a plurality of substrate traces or leads 50a–50n (FIG. 2), also formed on the substrate surface. Outer portions 38,39 of the substrate 32 extend laterally outwardly of the socket walls and are bent downwardly as shown in FIGS. 1 and 2 to ends 41,43 where the ends of substrate leads 50a–50n are electrically connected to pads, such as pads 45,47 on the printed circuit board 40. The outer portions of flexible circuit 32 extend through the walls of the socket in any suitable arrangement. In one configuration the walls may be formed with horizontal slots through which the flexible circuit outer portions extend. In the arrangement illustrated, the upper portions of the four walls of the socket are made separately from the base, which has short upstanding wall portions. After positioning the bladder the upper wall portions are positioned in precise alignment with the short upstanding wall portions and bonded to the substrate, which itself is bonded to the upstanding wall portions. If deemed necessary or desirable, alignment pins (not shown) accurately locate the bladder and socket portions relative to one another.

A detachable lid 56 has flexible latching fingers 58,60 that snap into recesses 62,64 formed in the outer side walls 22,23 to removably lock the lid to the socket after the package to be tested has been inserted.

Substrate 32, together with its test contacts 44 and electrically conductive traces 50a–50n, are formed by conventional processes for manufacture of tape circuitry. Generally these processes comprise the steps of depositing upon a thin, flexible dielectric substrate a selected pattern of contact pads and conductive trace circuitry, employing conventional photolithographic processes, electroplating techniques or the like. Such processes are well known, inexpensive and readily adapted to provide different selected patterns of traces and contacts therefor. The test contacts 44a–44n may be of spherical, conical or cylindrical configuration and are bonded to pads forming inner ends of the circuit traces 50a–50n.

FIG. 1 shows the socket with its detachable lid displaced, and with the ball grid array package not yet inserted into the socket. The bladder is not yet inflated. FIG. 3 shows the ball grid array package mounted within the socket and the bladder inflated. When pressurized fluid is introduced into the interior of the bladder 30, the back substrate 34 is restrained by rigid base 24. The upper substrate 32, being flexible and resilient, would bow upwardly into a curved configuration if it were not restrained by contact with a package in the socket. This curved configuration occurs only when there is no resistive force applied (acting downwardly as viewed in FIG. 3) against the substrate contacts 44a–44n. The substrate 32 and its test contacts are laterally fixed relative to the socket but are free to move away from the socket base because of the flexibility of the thin substrate.

In use of the test socket, the lid 56 is removed, the package 12 is inserted into the socket with side walls 22,23 and other sides of the socket providing a lateral positioning restraint and an insertion guide to properly orient and locate the package laterally within the socket. This properly positions and orients the package contacts 14a–14n in precise registration with the substrate contacts 44a–44n. The package is inserted to a position at or immediately adjacent the socket base 24, and lid 56 is replaced and attached to the socket walls by any suitable means, such as the flexible inwardly directed fingers 58,60 on the lid and recesses 62,64 in the socket walls.

With the package positioned within the socket and the lid latched to the side walls, the bottom of the lid bears against the top of the ball grid array package and prevents any motion of the package away from the base 24 toward the entrance opening (now closed by the lid) of the socket. With the package and lid in place, suitable electrical connections are made between test circuitry (not shown) and the circuit connection ends 41,43 of outer flexible circuit sections 38,39, and pressurized fluid is fed to the interior of the bladder 30 by means of conduit 42.

As described above, the flexible substrate 32 tends to bow upwardly when the interior of the bladder is pressurized. However, with the ball grid array package 10 positioned within the socket and restrained against upward motion by the lid 56, the curvature of the flexible substrate 32 is forced to conform to the configuration of the array of package ball contacts 14. Even though the package contacts 14a–14n may not form a precisely planar array, the flexibility of the substrate, urged toward the package over its entire area by the pressurized fluid within the bladder, enables all of the test contacts to touch corresponding package contacts regardless of any lack of planarity of the array of package contacts.

With all of the test contacts 44a–44n and package contacts 14a–14n in contact with one another, appropriate test signals are applied to the external circuit contacts, and the die or dies within the package 10 are tested. The package, of course, is readily removed from the test socket by releasing the resilient lid fingers 58,60, removing the lid and then lifting the package from the socket.

In an alternative configuration shown in FIG. 4, the socket includes walls 22,23, base 24 and lid 56, all substantially identical to the socket described above. However, in this embodiment, no pressurized bladder is used. Instead of a bladder, a resiliently compressible backup layer 70 is interposed between the base and the flexible circuit substrate 72 that carries the test contacts 44a–44n. Only a single thin flexible substrate layer 72 is used. The substrate 72, just like substrate 32 of FIGS. 1 and 3, includes a pattern of conductive traces formed on its surface, connected to the test contacts and extending along outer sections 74,76 for connection to pads on the test circuit printed circuit board 40.

In the arrangement of FIG. 4 the lid is mounted to the socket walls after the ball grid array package is in the socket. The lid, when latched, forces the package downwardly against substrate 72, causing the backup layer 70 to be compressed. The compressed backup layer resiliently and flexibly urges the substrate upwardly to force the test contacts 44a–44n to conform to the possibly non-planar configuration of the package contacts to ensure good electrical connection of all test contacts.

There have been described methods and apparatus for improved testing of a ball grid array package which are simpler and less expensive to manufacture, more sturdy and reliable and provide inherent self-alignment and self-planarization to accommodate package contacts that are not precisely planar.

We claim:

1. A test socket for use in testing an integrated circuit package having a plurality of package contacts projecting from one side of the package, said socket comprising:

a housing having sides, a base, an entrance opening, and a removable lid;

a substrate movably mounted in the socket at said base and having one side facing said entrance opening;

a plurality of test contacts on said one side of said substrate;

means for urging said substrate and its contacts toward said entrance opening; and a flexible bladder in said socket at said base, said substrate forming one side of said bladder and having said test contacts on an outer surface of said bladder remote from said base, said means for urging comprising means for flowing fluid under pressure into the interior of said bladder.

2. The test socket of claim 1 wherein said test contacts comprise conductive solder balls mounted on and movable with said substrate.

3. The test socket of claim 1, wherein said bladder further includes a flexible back substrate that forms another role of said bladder which faces said base.

4. The socket as defined in claim 1 wherein said lid has flexible latching fingers and said housing having recessed in the outer side walls for said latching fingers to removably snap into.

5. A test socket for use in testing an integrated circuit package having a plurality of package contacts projecting from one side of the package, said socket comprising:

a housing having sides, a base, and an entrance opening;

a substrate movably mounted in the socket at said base and having one side facing said entrance opening;

a plurality of test contacts on said one side of said substrate;

means for urging said substrate and its contacts toward said entrance opening;

wherein said sides of the socket are shaped to provide a lateral positioning restraint and an insertion guide to properly orient and locate the package laterally within the socket and precisely register the package contacts with said substrate contacts; and a lid for retaining the integrated circuit package within the socket;

wherein said lid has flexible latching fingers and said housing has recesses in outer side walls for said latching fingers to removably snap into.

6. A test socket for use in testing an integrated circuit package having a plurality of package contacts projecting from one side of the package, said socket comprising:

a housing having sides, a base, and an entrance opening;

a flexible substrate sheet mounted in said housing at said base and having a side facing said entrance opening;

a pattern of test contacts mounted at spaced locations on a perimeter area and in a center area of said side;

a pattern of traces on said side and electrically connected to said test contacts;

urging means for urging said flexible substrate sheet and said contacts toward said entrance opening;

wherein said sides of said housing are shaped to provide a lateral positioning restraint and an insertion guide to properly orient and locate the package laterally within said housing and register the package contacts with said test contacts; and a lid which retains the package within said housing and the package contacts in electrical contact with said test contacts.

7. The test socket of claim 6 wherein said flexible substrate sheet forms a surface of a pressurizable bladder, and said urging means includes a fluid pressure source for said bladder.

8. The test socket of claim 6 wherein said urging means includes a resiliently compressible backup layer between said flexible substrate sheet and said base.

9. A test socket for use in testing an integrated circuit package having a plurality of package contacts projecting from one side of the package, said socket comprising:

a housing having sides, a base, and an entrance opening;

a substrate mounted in said housing at said base and having one side facing said entrance opening;

a plurality of test contacts on said one side of said substrate;

urging means for urging said substrate and said test contacts toward said entrance opening;

wherein said sides of said housing are shaped and positioned to provide a lateral positioning restraint and an insertion guide to properly orient and locate the package laterally within said housing and register the package contacts with said test contacts;

a lid which when in a pressed-down position applies a downward force to retain the package in a testing position within said housing; and locking means for locking said lid in the pressed-down position.

10. The test socket of claim 9 wherein said locking means includes at least one detent on one of said housing and said lid.

11. The test socket of claim 9 wherein said locking means includes a flexible latching finger on one of said lid and said housing and a corresponding recess on the other for receiving said finger therein.

12. A test socket for testing an integrated circuit package having on one side thereof a plurality of package contacts, said socket comprising:

a pressurizable bladder including top and bottom substrates secured together;

a test socket compartment including at least one wall, said bladder being disposed in said test socket compartment;

an outer portion of said top substrate extending through said wall for electrical connection to test circuitry; and test contacts on a surface of said top substrate for registration with the package contacts of the package when positioned in said compartment and said bladder pressurized.

13. The test socket of claim 12 wherein said top substrate comprises a flexible dielectric circuit.

14. The test socket of claim 12 further comprising a retainer lid securable relative to said compartment and bearing against and retaining the package therein.

15. The test socket of claim 12 wherein said top substrate includes conductive trace circuitry on a top surface and operatively connected to said test contacts.

16. The test socket of claim 12 further comprising a conduit communicating with an interior of said bladder and passing out of said compartment for connection to a pressure fluid source.

* * * * *